(12) United States Patent
Tanaka et al.

(10) Patent No.: US 8,409,348 B2
(45) Date of Patent: Apr. 2, 2013

(54) PRODUCTION METHOD OF ZINC OXIDE SINGLE CRYSTAL

(75) Inventors: Yoshizumi Tanaka, Yamaguchi (JP);
Itsuhiro Fujii, Yamaguchi (JP)

(73) Assignee: Ube Industries, Ltd. (JP)

( * ) Notice: Subject to any disclaimer, the term of this patent is extended or adjusted under 35 U.S.C. 154(b) by 827 days.

(21) Appl. No.: 12/531,087

(22) PCT Filed: Mar. 14, 2008

(86) PCT No.: PCT/JP2008/055198
§ 371 (c)(1),
(2), (4) Date: Sep. 14, 2009

(87) PCT Pub. No.: WO2008/114855
PCT Pub. Date: Sep. 25, 2008

(65) Prior Publication Data
US 2010/0107967 A1    May 6, 2010

(30) Foreign Application Priority Data
Mar. 16, 2007    (JP) .................................. 2007-068848

(51) Int. Cl.
*C30B 9/00* (2006.01)
*C30B 15/00* (2006.01)

(52) U.S. Cl. ................ 117/54; 117/37; 117/49; 117/73; 117/944; 117/956

(58) Field of Classification Search ............ 117/54, 117/73, 37, 49, 944, 956
See application file for complete search history.

(56) References Cited

U.S. PATENT DOCUMENTS

| | | | | |
|---|---|---|---|---|
| 5,788,764 A | * | 8/1998 | Sato | .................................. 117/28 |
| 2002/0185055 A1 | * | 12/2002 | Oka | .................................. 117/36 |
| 2009/0044745 A1 | | 2/2009 | Sekiwa et al. | |

FOREIGN PATENT DOCUMENTS

| | | |
|---|---|---|
| CN | 101384756 A | 3/2009 |
| EP | 1 266 982 A2 | 12/2002 |
| JP | 74044870 B | 11/1974 |
| JP | 04-367588 A | 12/1992 |
| JP | 2002-193698 A | 7/2002 |
| JP | 2003-002790 A | 1/2003 |

OTHER PUBLICATIONS

Fischer et al., "On the Preparation of ZnO Single Crystals," Crystal Research and Technology (1981) p. 689-694.*
Brodichko et al, English Abstract of "Growth of zinc oxide crystals from tungstate and molybdate melts" (1970), Uchenye Zapiski, Tiraspol'skii Gosudarstvennyl Pedagogicheskil Institute, No. 21 (pt 1) p. 13-17.*

(Continued)

*Primary Examiner* — Matthew Song
(74) *Attorney, Agent, or Firm* — DLA Piper LLP (US)

(57) ABSTRACT

A production method of a zinc oxide single crystal, comprising depositing a crystal of zinc oxide on a seed crystal from a mixed melt of zinc oxide and a solvent capable of melting zinc oxide and having a higher average density than zinc oxide in the melt. Preferably, a zinc oxide single crystal is continuously pulled while supplying the same amount of a zinc oxide raw material as that of the pulled zinc oxide. A single crystal excellent in the crystal quality and long in the pulling direction can be continuously produced.

19 Claims, 2 Drawing Sheets

OTHER PUBLICATIONS

J.W. Nielsen et al., "The Growth of Large Single Crystals of Zinc Oxide," J. Phys. Chem., vol. 64, No. 11, 1960, pp. 1762-1763.

B.M. Wanklyn, "The Growth of ZnO Crystals From Phosphate and Vanadate Fluxes," J. of Crystals Growth, vol. 7, No. 1, 1970, pp. 107-108.

X.H. Li et al., "Bridgman Growth of ZnO Crystals From High Temperature Solution," Appl. Phys. A, vol. 82, No. 2, 2006, pp. 373-376.

Grigorjev, I.S. et al., "Physical Magnitudes," *Energoatomizdat' Publisher*, Handbook Edition, Moscow, 1991, cover page, pp. 108 and 111.

* cited by examiner

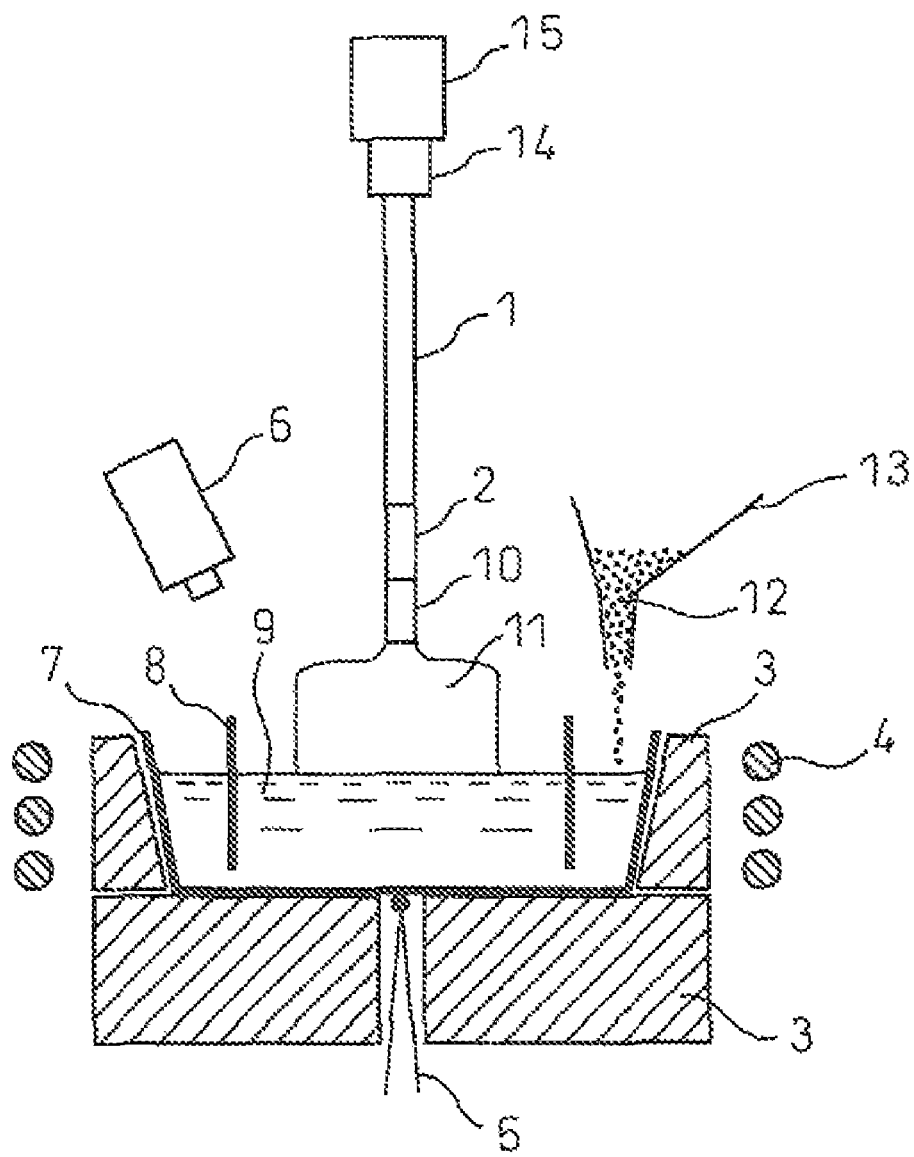

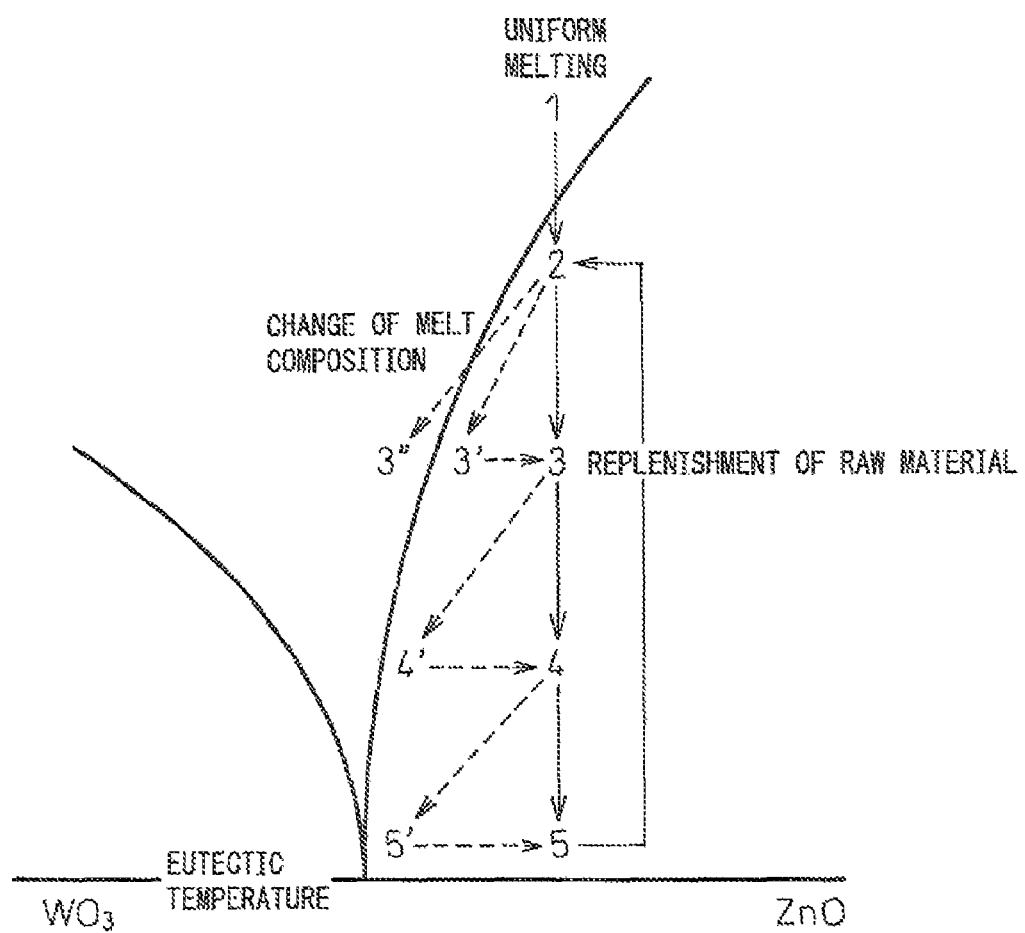

PRODUCTION METHOD OF ZINC OXIDE SINGLE CRYSTAL

CROSS-REFERENCE TO RELATED APPLICATIONS

This application is based upon and claims the benefit of priority from Japanese Patent Application No. 2007-68848, filed on Mar. 16, 2007, the disclosure of which is incorporated herein by reference.

TECHNICAL FIELD

The present invention relates to a production method of a zinc oxide single crystal. More specifically, the present invention relates to a method for producing a zinc oxide single crystal by a melt-pulling method.

BACKGROUND ART

Zinc oxide (ZnO) is applied to, for example, a pyroelectric element, a piezoelectric device, a gas sensor and a transparent electrically conductive film, but zinc oxide is a direct transition-type semiconductor having a forbidden band width of 3.4 eV and is promising as a material for an LED in the blue to ultraviolet region or other photoelectric devices.

Regarding the conventionally employed hydrothermal synthesis method or flux method, not only a large single crystal is difficult to produce, but also the hydrothermal synthesis method requires a special production apparatus that generates a high temperature and a high pressure and is disadvantageous in view of cost. A molecular beam epitaxy method and the like have been also proposed, and such a method is suitable for the production of a single crystal thin film, but not for the production of a large single crystal. Under these circumstances, a melt pulling method using vanadium oxide or molybdenum oxide as the solvent with boron oxide has been proposed (see, Japanese Unexamined Patent Publication (Kokai) Nos. 2002-193698 and 2003-2790).

In the context of the present invention, the term "solute" is zinc oxide, the term "solvent" is the substance for melting the solute and containing one or more kinds of compounds such as an oxide or halide (e.g., fluoride, chloride), and the "melt" is a state where the solute is melted in the solvent, and depending on the case, includes a state where a part of the melted solute is precipitated and a solid and a liquid are present together. The liquid part in this case is referred to as a "liquid phase" for differentiating it from the melt.

In Japanese Unexamined Patent Publication (Kokai) No. 2002-193698, zinc oxide as the solute and vanadium oxide and/or boron oxide as the solvent are mixed and melted under heating and thereafter, the melt temperature is lowered to deposit and grow a fine crystal of zinc oxide ZnO on a seed crystal or a substrate. At this time, the temperature in the part of the seed crystal contacting the melt becomes lower by several tens of ° C. than the melt temperature because heat is dissipated from a rod to which the seed crystal is fixed. The crystal of zinc oxide is thereby selectively deposited on the seed crystal. In Japanese Unexamined Patent Publication (Kokai) No 2003-2790, zinc oxide as the solute and molybdenum oxide as the solvent are mixed and melted under heating and thereafter, the melt temperature is maintained at a fixed temperature or lowered to deposit and grow a fine crystal of zinc oxide ZnO on a seed crystal or a substrate.

DISCLOSURE OF THE INVENTION

Production of a large zinc oxide single crystal is possible by the melt pulling method, but there is a demand to enhance the quality of a single crystal, produce a larger single crystal and raise productivity by enabling continuous production.

In the melt pulling method, when a solvent comprising one compound or two or more compounds and having an average density higher than the density of zinc oxide is used at the time of pulling a zinc oxide single crystal from a melt, a high-quality zinc oxide crystal can be produced. Furthermore, when the same amount of a zinc oxide raw material as that of the zinc oxide pulled is supplied to the melt, a zinc oxide single crystal can be continuously produced, the zinc oxide single crystal pulled can be made longer, and the productivity can also be raised. Based on these ideas, the present invention provides the followings.

(1) A production method of a zinc oxide single crystal, comprising depositing a crystal of zinc oxide on a seed crystal from a mixed melt of zinc oxide and a solvent capable of melting zinc oxide and having a higher average density than zinc oxide in the melt.

(2) The production method of a zinc oxide single crystal as described in (1) above, which is a method of depositing a crystal of zinc oxide on a seed crystal from a mixed melt with a solvent capable of melting zinc oxide as the solute and producing a single crystal of zinc oxide while pulling it from the melt, wherein the same amount of a zinc oxide raw material as that of the zinc oxide pulled is supplied at the pulling to continuously pull a zinc oxide single crystal.

(3) The production method of a zinc oxide single crystal as described in (2) above, wherein after pulling a specific amount of a zinc oxide crystal from the melt, an operation of supplying the same amount of a zinc oxide raw material as that of the pulled zinc oxide to the melt and again pulling a zinc oxide crystal from the melt is repeated and the pulling amount of zinc oxide is controlled to an amount not allowing the composition of the melt in the vicinity of a crystal to become a composition composed of only a liquid phase above a liquidus line in the phase diagram of a system using a solvent and zinc oxide as components.

(4) The production method of a zinc oxide single crystal as described in (1) to (3) above, wherein the zinc oxide raw material is preheated and then supplied.

(5) The production method of a zinc oxide single crystal as described in (4) above, wherein the difference of the preheating temperature from the melt temperature is within 100° C.

(6) The production method of a zinc oxide single crystal as described in (2) to (5) above, wherein a weir is provided between the crystal pulling area for pulling a crystal from a melt and the supply part for supplying a zinc oxide raw material so as not to cause turbulence in the melt in the crystal pulling area at the time of supplying a zinc oxide raw material.

(7) The production method of a zinc oxide single crystal as described in (1) to (6) above, wherein the solvent is a solvent formed of one or more kinds of compounds giving a eutectic composition of 30 to 99.9 mol % in terms of the zinc oxide concentration and having a eutectic temperature of 700 to 1,720° C., which are a compound forming a eutectic phase diagram with zinc oxide as the solute.

(8) The production method of a zinc oxide single crystal as described in (1) to (7) above, wherein a compound forming a eutectic phase diagram with zinc oxide as the solute and having an average density (at room temperature) of 5.6 g/cm$^3$ or more in a solid state is used as the solvent.

(9) The production method of a zinc oxide single crystal as described in (1) to (8) above, wherein the compound constituting the solvent contains one or more members out of an oxide and a halide such as fluoride and chloride.

(10) The production method of a zinc oxide single crystal as described in (1) to (9) above, wherein the mixing ratio between zinc oxide and the compound constituting the solvent is from 99.9 to 30 mol % vs. from 0.1 to 70 mol % and the mixing ratio between respective solvents is from 0 to 100 mol %.

(11) The production method of a zinc oxide single crystal as described in (1) to (10) above, wherein the compound constituting the solvent contains one or more members out of tungsten oxide ($WO_3$), lead fluoride ($PbF_2$), lead chloride ($PbCl_2$), niobium oxide ($Nb_2O_5$), cobalt monoxide (CoO), silicon dioxide ($SiO_2$), titanium oxide ($TiO_2$), aluminum oxide ($Al_2O_3$) and sodium tetraborate ($Na_2B_4O_7$).

BRIEF DESCRIPTION OF THE DRAWINGS

FIG. 1 illustrates an example of the apparatus for continuously pulling a zinc oxide single crystal of the present invention.

FIG. 2 is a phase diagram for illustrating the procedure for producing a zinc oxide single crystal by the present invention.

BEST MODE FOR CARRYING OUT THE INVENTION

The present invention is a method for producing a high-quality zinc oxide crystal by using, as the solvent, a solvent having a higher average density than the density of zinc oxide when pulling a zinc oxide single crystal from a melt by a melt pulling method. Furthermore, the present invention is a method for continuously producing a zinc oxide single crystal by depositing a crystal of zinc oxide on a seed crystal from a mixed melt with a solvent capable of melting zinc oxide as the solute, pulling a zinc oxide single crystal deposited on the seed crystal from the melt to grow the zinc oxide single crystal, and at the same time, supplying the same amount of a zinc oxide raw material as that of zinc oxide pulled to the melt, thereby continuously producing a zinc oxide single crystal. Preferably, a solvent formed of a compound having a higher average density than the density of zinc oxide is used, and the zinc oxide raw material that is additionally supplied to the melt, is preheated and then supplied. Since a zinc oxide single crystal is continuously pulled, the dimension of the zinc oxide single crystal can be made large and the production efficiency can be enhanced.

The zinc oxide as the raw material is not particularly limited in its form and the like and may be sufficient if it can be continuously supplied to a melt. For example, zinc oxide in a powder form, or zinc oxide obtained by granulating a powder by a spray drier or the like, or a pellet obtained by sintering the powder, or a molded rod form may be used as the raw material.

In the present invention, a solvent having a higher average density than the density of zinc oxide is used as the solvent. The solvent may be formed from one compound or two or more compounds, but the average density of the solvent formed from one compound or two or more compounds is higher than the density of zinc oxide. When a solvent having a density higher than the density of zinc oxide is used, zinc oxide ZnO is liable to segregate in the upper part of the melt and therefore, the quality of the zinc oxide crystal is enhanced. Furthermore, the segregation works in favor of pulling and an effect enabling elevation of the pulling rate is obtained.

For preparing a solvent composed of one compound or two or more compounds capable of melting zinc oxide and having an average density higher than that of zinc oxide in the melt, simply and easily, since the density (at room temperature) of zinc oxide ZnO is 5.6 $g/cm^3$, a solvent containing one or more kinds of compounds having a density (at room temperature) of 5.6 $g/cm^2$ or more, which are a compound forming a eutectic phase diagram with zinc oxide as the solute, may be used.

The compound constituting the solvent is not limited as long as it is a solvent capable of melting zinc oxide as the solute and depositing a zinc oxide crystal on a seed crystal from a mixed melt with the solute, but for example, one member or two or more members out of tungsten oxide ($WO_3$), aluminum oxide ($Al_2O_3$), molybdenum oxide ($MoO_3$), titanium oxide ($TiO_2$), lead fluoride ($PbF_2$), lead chloride ($PbCl_2$), niobium oxide ($Nb_2O_5$), cobalt monoxide (CoO), tricobalt tetroxide ($Co_3O_4$), manganese monoxide (MnO), manganese dioxide ($MnO_2$), dimanganese trioxide ($Mn_2O_3$) and trimanganese tetroxide ($Mn_3O_4$) may be contained. It is preferred to contain one or more members out of tungsten oxide ($WO_3$), lead fluoride ($PbF_2$), lead chloride ($PbCl_2$), niobium oxide ($Nb_2O_5$), cobalt monoxide (CoO), silicon dioxide ($SiO_2$), titanium oxide ($TiO_2$), aluminum oxide ($Al_2O_3$) and sodium tetraborate ($Na_2B_4O_7$). Above all, tungsten oxide ($WO_3$), lead fluoride ($PbF_2$), lead chloride ($PbCl_2$), niobium oxide ($Nb_2O_5$) and cobalt monoxide (CoO) are advantageous in view of production because of their low eutectic temperature and are preferred.

In the case of containing two or more members, the mixing ratio between respective solvents may be from 0 to 100 mol % but is preferably from 0.001 to 99.999 mol %.

The solvent is preferably a solvent formed of one or more kinds of compounds giving a eutectic composition of 5 to 99.9 mol % in terms of the zinc oxide concentration and having a eutectic temperature of 700 to 1,720° C., which are a compound forming a eutectic phase diagram with zinc oxide as the solute. When such a solvent is used, the gradient of the liquidus line can be controlled and therefore, the amount of a single crystal that can be collected by a pulling method is increased or the controllability at the production is enhanced.

The compound constituting the solvent may contain two or more members out of an oxide and a halide such as fluoride and chloride. Combination of such solvents more facilitates the control of gradient of the liquidus line and produces an effect of increasing the amount of a single crystal that can be collected by a pulling method or enhancing the controllability at the production.

The mixing ratio between zinc oxide as the raw material and the compound constituting the solvent is preferably from 99.9 to 30 mol % vs. from 0.1 to 70 mol %. The mixing ratio between respective solvents may be from 0 to 100 mol %. By combining solvents, the gradient of the liquidus line can be controlled and therefore, the amount of a single crystal that can be collected by a pulling method is increased or the controllability at the production is enhanced, but the mixing ratio between zinc oxide and the compound constituting the solvent is in the above-described range and when the mixing ratio is in this range, successful pulling can be achieved. For example, if the solvent amount exceeds 99.9 mol %, the melting point of the melt rises and since zinc oxide as the raw material is sublimated out, a melt cannot be produced, making it difficult to pull a single crystal. On the other hand, if the solvent amount is less than 30 mol %, the eutectic composition is surpassed and zinc oxide does not deposit.

ZnO is known to markedly change its properties by the commingling of a hetero-element, and mixing of several % or less of Li, Na, K, Cu, Ag, N, P, As, Cr, Al, Bi, Sb, Co, Fe, Ni, Ti, Mn, V or Pr is employed in applications such as P-type semiconductor, magnetic semi-conductor, electrical conductivity control and varistor.

In the present invention, a ZnO single crystal is continuously deposited and grown on ZnO or a seed crystal close in the lattice constant and melting point to ZnO from a compositional solution based on zinc oxide and a solvent, whereby a ZnO single crystal is produced.

In the bath containing zinc oxide and a solvent, the components are melted at a temperature on a liquidus line under heating, the temperature is lowered to deposit zinc oxide in the melt and crystallize the same on a seed crystal, and the crystallized zinc oxide single crystal is pulled up to allow the single crystal to grow. The pulling method itself is known and may be the same, for example, as the methods described in Japanese Unexamined Patent Publication (Kokai) Nos. 2002-193698 and 2003-2790.

As for other production conditions, although not limited, the pulling rate is preferably from 0.5 to 50 mm/day, more preferably from 0.5 to 10 mm/day, the rotation speed is preferably from 0 to 700 rpm, more preferably from 0 to 400 rpm, and the dropping rate of the melt temperature is preferably from 0.5 to 10° C./hour, more preferably from 0.5 to 5° C./hour. The pulling rate is preferably lower from the standpoint of crystal quality but is preferably higher in view of production speed. When the pulling rate is in the range above, a crystal of zinc oxide can be produced with no effect on the crystal quality. As for the rotation speed, a number of rotations in the above-described wide range is used so as to obtain an effect of stirring the melt and throw off an unnecessary solvent. The number of rotations is preferably as large as possible for throwing off the unnecessary solvent but if the number of rotations is excessively large, turbulence is generated in the melt and this adversely affects the crystal growth. For this reason, the number of rotations is preferably in the above-described range. The cooling rate is preferably in the range above in view of crystal quality and productivity.

In the present invention, along with pulling of a zinc oxide single crystal to allow the single crystal to grow, the same amount of a zinc oxide raw material as the amount of the zinc oxide single crystal pulled is supplied to the bath before no deposition of zinc oxide occurs due to decrease of zinc oxide in the bath composition.

The method for measuring the amount of the zinc oxide single crystal pulled and the method for supplying a zinc oxide raw material to the bath are not particularly limited. For example, the amount of the zinc oxide single crystal pulled can be measured by a load cell.

The supply of a zinc oxide raw material to the bath need not be completely continuously synchronized with the amount of the zinc oxide single crystal pulled but may be effected by, after pulling a specific amount of zinc oxide single crystal, repeating an operation of supplying the same amount of a zinc oxide raw material as the pulling amount to the bath and again pulling a specific amount of zinc oxide single crystal. The latter supply method is advantageous in that pulling can be performed while homogenizing (stabilizing) the melt composition. However, if a zinc oxide single crystal is pulled in an excessively large amount before the raw material is supplied, the melt composition becomes a composition above the liquidus line, where a solid phase is not present and only a liquid phase remains, and pulling cannot be performed. Therefore, the pulling amount should not be more than that. Also, if the amount of the zinc oxide raw material supplied at one time is excessively large, the bath temperature may abruptly drop to deteriorate the crystal quality, and therefore, the raw material is preferably supplied in an amount causing no abrupt drop of the bath temperature. Also, the supply of the same amount of a zinc oxide raw material as the pulling amount need not be performed accurately every individual supplies but may be sufficient if it is controlled to a range where continuous production can be performed in the entire process.

The zinc oxide raw material that is supplied in accordance with the pulling amount is preferably preheated and then supplied. If the zinc oxide raw material supplied is at a low temperature, unevenness may occur in the melt temperature to deteriorate the crystal quality. Supply of the zinc oxide raw material after preheating is preferred from the standpoint of preventing unevenness of the melt temperature and stabilizing the crystal quality. The temperature when preheating the zinc oxide raw material is preferably the same as the melt temperature, but a temperature higher than the melt is also preferred. The preheating temperature is sufficient if it is lower than the sublimation temperature of the zinc oxide raw material. Furthermore, even if the preheating temperature is lower than that of the melt, when the zinc oxide raw material is preheated, the effect of preheating is obtained. The preheating temperature causes no problem if the difference from the melt temperature is within 100° C., but the temperature difference is preferably within 50° C.

The zinc oxide raw material that is supplied in accordance with the pulling amount may be supplied as gently as possible at a position as remote as possible from the crystal pulling part so as to cause no turbulence in the melt, particularly in the melt in the crystal pulling area. As illustrated in FIG. 1, a weir (crucible 8) may be provided between the supply part for the zinc oxide raw material and the crystal pulling part, so that the melt can be introduced into the crystal pulling part (for example, through a throat below the weir) after the turbulence in the melt in the raw material supply part, which is generated due to supply of the raw material, is settled.

It is confirmed by the present invention that when a solvent composed of a compound having a higher average density than the density of zinc oxide is used, a high-quality zinc oxide crystal can be produced; when pulling is repeated by the later-described procedure shown in FIG. 2, a long single crystal can be continuously produced by a pulling method; and moreover, when a compound having a density larger than that of zinc oxide is used as the solvent, the pulling rate can be raised.

EXAMPLES

Example 1

An example of producing a zinc oxide single crystal by a continuous pulling method is specifically described below. FIG. 1 illustrates an apparatus for continuously pulling a zinc oxide single crystal. In FIG. 1, 1 is an alumina supporting rod, 2 is a platinum supporting rod, 3 is an insulating wool, 4 is a high-frequency heating coil, 5 is a platinum-rhodium thermocouple, 6 is a radiation thermometer, 7 is a platinum outer crucible, 8 is a platinum inner crucible, 9 is a melt, 10 is a seed crystal, 11 is a grown single crystal, 12 is zinc oxide (raw material), 13 is a supply device for raw material zinc oxide, 14 is a load cell, and 15 is a motor.

The production is described in accordance with the production procedure shown in FIG. 2. A seed crystal 10 was fixed to the platinum supporting rod 2 with a platinum wire, and the resulting rod was further fixed to the alumina supporting rod 1 with a platinum wire, whereby the melt 9 could be prevented from coming into contact and reacting with the alumina supporting rod 1. Zinc oxide (density: 5.6 g/cm$^3$): tungsten oxide (density: 7.16 g/cm$^3$) were mixed in a ratio of 71.5:28.5 by mol %, and 500 g of the mixture was filled in the platinum crucible 7 having an opening diameter of 100 mm and a height of 70 mm and serving also as a heating element. The crucible was heated to about 1,350° C. by an induction heating system using a high-frequency heating coil 4 to uniformly melt the raw materials and then cooled to 1,300° C. (in FIG. 2, 1→2). A zinc oxide single crystal 10 as the seed crystal was put into contact with the melt surface. When the melt was gradually cooled, a crystal of zinc oxide was deposited from the interface between the seed crystal at a lowest temperature and the melt. In this way, a grown crystal was gradually pulled, whereby a single crystal could be obtained. However, in this method, the temperature is changed in the course of proceeding from 2 to 3 in FIG. 2 and as a result of pulling of the zinc oxide single crystal, the composition of the melt changes from 2 to 3'. At this time, if the pulling amount is excessively large, the melt composition becomes a composition (3") of the liquidus line, where a solid phase of zinc oxide is not present but only a liquid phase remains in the melt, and pulling cannot be continued. Therefore, it is necessary that the pulling amount be controlled to prevent the melt composition from becoming a composition of the liquidus line. When the melt composition reached 3', the same amount of raw material zinc oxide as the weight of the pulled single crystal measured by the load cell 14 was replenished from the supply device 13 for raw material zinc oxide to return the melt composition to 3 from 3', whereby pulling was continued. This operation was stopped at a temperature higher than the eutectic temperature by 5 to 10° C. and after returning the melt composition to 5 and again setting the melt temperature to 2, pulling was continuously performed. By continuing this cycle, a single crystal long in the pulling direction could be continuously produced. As for other production conditions here, the pulling rate was from 1 to 5 mm/day, the rotation speed was from 0 to 400 rpm, and the dropping rate of the melt temperature was from 1 to 10° C./hour. The obtained crystal had a size of 20×20×40 mm, and a substantially transparent zinc oxide single crystal with little impurities could be produced in 10 days.

Example 2

A zinc oxide single crystal was produced by a continuous pulling method using the same apparatus as in Example 1. Zinc oxide:tungsten oxide (density: 7.16 g/cm$^3$) were mixed in a ratio of 71.5:28.5 by mol %, and the mixture was filled in the platinum crucible 7 and thoroughly melted by heating to 1,350° C. After cooling to 1,250° C., pulling was started by maintaining the melt at 1,250°. In the case of performing the pulling under the condition of constant temperature, the weight of the pulled single crystal was measured by the load cell, the melt composition was controlled to a composition not exceeding the liquidus line and while intermittently replenishing the same weight of raw material zinc oxide as the weight of the pulled single crystal from the supply device 13 for raw material zinc oxide, pulling was continued. The melt composition is preferably controlled in as small a pulling amount as possible, because if the pulling amount is large, the replenishing amount is increased and abrupt drop of the melt temperature occurs at the replenishment of raw material and adversely affects the growth of the single crystal. In this Example, every time when the weight of the single crystal was increased by 0.1 to 0.5 g, raw material zinc oxide was filled with care to prevent the melt temperature from abrupt change. As for production conditions here, the pulling rate was from 1 to 5 mm/day, and the rotation speed was from 0 to 400 rpm. The obtained zinc oxide single crystal had a size of 20×20×35 mm, and a pale yellow zinc oxide single crystal with little impurities could be produced in 10 days.

Example 3

A zinc oxide single crystal was produced by a continuous pulling method using the same apparatus as in Example 1. Zinc oxide:niobium oxide (density: 5.9 g/cm$^3$) were mixed in a ratio of 84.6:15.4 by mol %, and the mixture was filled in the platinum crucible 7 and thoroughly melted by heating to 1,450° C. After cooling to 1,400° C., pulling was started. As for production conditions here, the pulling rate was from 1 to 5 mm/day, the rotation speed was from 0 to 400 rpm, and the dropping rate of the melt temperature was from 1 to 10° C./how. The obtained zinc oxide single crystal had a size of 20×20×35 mm, and a pale yellow zinc oxide single crystal with little impurities could be produced in 10 days.

Example 4

A zinc oxide single crystal was produced by a continuous pulling method using the same apparatus as in Example 1. Zinc oxide:lead fluoride (density: 8.4 g/cm$^3$) were mixed in a ratio of 25:75 by mol %, and the mixture was filled in the platinum crucible 7 and thoroughly melted by heating to 1,200° C. After cooling to 1,100° C., pulling was started. As for production conditions here, the pulling rate was from 1 to 5 mm/day, the rotation speed was from 0 to 400 rpm, and the dropping rate of the melt temperature was from 1 to 10° C./hour. The obtained zinc oxide single crystal had a size of 20×20×35 mm, and a substantially transparent zinc oxide single crystal with little impurities could be produced in 10 days.

Example 5

A zinc oxide single crystal was produced by a continuous pulling method using the same apparatus as in Example 1. Zinc oxide:tungsten oxide (density: 7.16 g/cm$^3$):sodium tetraborate (density: 2.36 g/cm$^3$) were mixed in a ratio of 70:24:6 by mol %. In this composition, the average density of tungsten oxide and sodium tetraborate was 6.2 g/cm$^3$. The mixture was filled in the platinum crucible 7 and thoroughly melted by heating to 1,300° C. After cooling to 1,250° C., pulling was started. As for production conditions here, the pulling rate was from 1 to 5 mm/day, the rotation speed was from 0 to 400 rpm, and the dropping rate of the melt temperature was from 1 to 10° C./hour. The obtained zinc oxide single crystal had a size of 20×20×35 mm, and a substantially transparent zinc oxide single crystal with little impurities could be produced in 10 days.

Example 6

A zinc oxide single crystal was produced by a pulling method using the same apparatus as in Example 1 without supplying raw material zinc oxide. Zinc oxide:tungsten oxide (density: 7.16 g/cm$^3$) were mixed in a ratio of 71.5:28.5 by mol %, and the mixture was filled in the platinum crucible 7, thoroughly melted by heating to 1,350° C. and then cooled to 1,300° C. As for production conditions here, the pulling rate was from 1 to 5 mm/day, the rotation speed was from 1 to 400 rpm, and the dropping rate of the melt temperature was from 1 to 10° C./hour. The obtained zinc oxide single crystal had a size of 20×20×1 mm, and a pale yellow zinc oxide single crystal with little impurities could be produced, but production in 2 days or more could not be implemented.

Comparative Example 1

A zinc oxide single crystal was produced by a continuous pulling method using the same apparatus as in Example 1. Zinc oxide:vanadium oxide ($V_2O_5$) (density: 3.4 g/cm$^3$) were mixed in a ratio of 85:15 by mol %, and the mixture was filled in the platinum crucible 7 and thoroughly melted by heating to 1,300° C. After once cooling to 1,280° C., crystal production was started. As for production conditions here, the pulling rate was from 1 to 5 mm/day, the rotation speed was from 1 to 400 rpm, and the dropping rate of the melt temperature was from 1 to 10° C./hour. The obtained zinc oxide single crystal had a size of 8×8×20 (length in the pulling direction) mm, and a dark green zinc oxide single crystal with many impurities was produced in 10 days.

Comparative Example 2

A zinc oxide single crystal was produced by a continuous pulling method using the same apparatus as in Example 1. Zinc oxide:molybdenum oxide ($MoO_3$) (density: 4.7 g/cm$^3$) were mixed in a ratio of 54:46 by mol %, and the mixture was filled in the platinum crucible 7 and thoroughly melted by heating to 1,200° C. After cooling to 1,150° C., production of a crystal was started. The production conditions for the pulling rate was from 1 to 5 mm/day, the rotation speed was from 1 to 400 rpm, and the dropping rate of the melt temperature was from 1 to 10° C./hour. The obtained zinc oxide single crystal had a size of 9×9×15 (length in the pulling direction) mm, and a dark blue zinc oxide single crystal with many impurities was produced in 10 days.

INDUSTRIAL APPLICABILITY

Zinc oxide (ZnO) is a promising material as a material for a power collecting device, a piezoelectric device, a gas sensor, a transparent electrically conductive film, LED in the blue to ultraviolet region, and other photoelectric devices. The present invention enables enhancement of the quality of a large zinc oxide single crystal produced by a melt pulling method, growth of a larger single crystal, continuous production, and more increase of the productivity, and therefore, industrial utility of the present invention is evident.

The invention claimed is:

1. A method of producing a zinc oxide single crystal by pulling from a melt comprising:
   depositing a crystal of zinc oxide on a seed single crystal at an upper portion of and from a mixed melt of zinc oxide and a solvent that melts zinc oxide by cooling said mixed melt, said solvent being formed of one or more kinds of compounds forming a eutectic phase diagram with zinc oxide as the solute, said solvent having a higher density than zinc oxide in the melt, and
   pulling the zinc oxide crystal,
   wherein a same amount of a zinc oxide raw material as that of the zinc oxide is supplied during said pulling to continuously pull a zinc oxide single crystal.

2. The method as claimed in claim 1, wherein a crystal of zinc oxide is deposited on a seed crystal from said mixed melt and a single crystal of zinc oxide is pulled from the melt.

3. The method as claimed in claim 2, wherein, after pulling a specific amount of a zinc oxide crystal from the melt, supplying the same amount of a zinc oxide raw material as that of the pulled zinc oxide to the melt and again pulling a zinc oxide crystal from the inch is repeated and the pulling amount of zinc oxide is controlled to an amount not allowing the composition of the melt in the vicinity of a crystal to become a composition composed of only a liquid phase above a liquidus line in a phase diagram of a system using a solvent and zinc oxide as components.

4. The method as claimed in claim 1, wherein the zinc oxide raw material is preheated and then supplied.

5. The method as claimed in claim 4 wherein the difference of preheating temperature from melt temperature is within 100° C.

6. The method as claimed in claim 2, wherein a weir is provided between a crystal pulling area for pulling a crystal from a melt and the supply part for supplying a zinc oxide raw material to not cause turbulence in the melt in the crystal pulling area at the time of supplying a zinc oxide raw material.

7. The method as claimed in claim 1, wherein said solvent is formed of one or more kinds of compounds giving a eutectic composition of 30 to 99.9 mol % in terms of zinc oxide concentration and having a eutectic temperature of 700 to 1,720° C., which are a compound forming a eutectic phase diagram with zinc oxide as a solute.

8. The method as claimed in claim 1. wherein a compound forming a eutectic phase diagram with zinc oxide as a solute and having an density (at room temperature) of 5.6 g/cm$^3$ or more in a solid state is used as said solvent.

9. The method as claimed in claim 1, wherein a compound constituting said solvent contains one or more of an oxide and a halide.

10. The method as claimed in claim 1, wherein a mixing ratio between zinc oxide and a compound constituting said solvent is 99.9 to 30 mol %/0.1 to 70 mol % and a mixing ratio between respective solvents is from 0 to 100 mol %.

11. The method as claimed in claim 1, wherein a compound constituting said solvent contains one or more of tungsten oxide ($WO_3$), lead fluoride ($PbF_2$), lead chloride ($PbCl_2$), niobium oxide ($Nb_2O_5$), cobalt monoxide (CoO), silicon dioxide ($SiO_2$), titanium oxide ($TiO_2$), aluminum oxide ($Al_2O_3$) and sodium tetraborate ($Na_2B_4O_7$).

12. The method as claimed in claim 2, wherein the zinc oxide raw material is preheated and then supplied.

13. The method as claimed in claim 3, wherein the zinc oxide raw material is preheated and then supplied.

14. The method as claimed in claim 3, wherein a weir is provided between a crystal pulling area for pulling a crystal from a melt and the supply part for supplying a zinc oxide raw material to not cause turbulence in the melt in the crystal pulling area at the time of supplying a zinc oxide raw material.

15. The method as claimed in claim 2, wherein said solvent is formed of one or more kinds of compounds giving a eutectic composition of 30 to 99.9 mol % in terms of zinc oxide concentration and having a eutectic temperature of 700 to 1,720° C., which are a compound forming a eutectic phase diagram with zinc oxide as a solute.

16. The method as claimed in claim 2, wherein a compound forming a eutectic phase diagram with zinc oxide as a solute and having an density (at room temperature) of 5.6 g/cm$^3$ or more in a solid state is used as said solvent.

17. The method as claimed in claim 2, wherein a compound constituting said solvent contains one or more of an oxide and a halide.

18. The method as claimed in claim 2, wherein a mixing ratio between zinc oxide and a compound constituting said solvent is 99.9 to 30 mol %/0.1 to 70 mol % and a mixing ratio between respective solvents is from 0 to 100 mol %.

19. The method as claimed in claim 2, wherein a compound constituting said solvent contains one or more of tungsten oxide ($WO_3$), lead fluoride ($PhF_2$), lead chloride ($PbCl_2$), niobium oxide ($Nb_2O_5$), cobalt monoxide (CoO), silicon dioxide ($SiO_2$), titanium oxide ($TiO_2$), aluminum oxide ($Al_2O_3$) and sodium tetraborate ($Na_2B_4O_7$).

* * * * *